United States Patent
Venkatkrishnan et al.

(10) Patent No.: US 6,403,385 B1
(45) Date of Patent: *Jun. 11, 2002

(54) METHOD OF INSPECTING A SEMICONDUCTOR WAFER FOR DEFECTS

(75) Inventors: Subramanian Venkatkrishnan, Sunnyvale; Tho L. La; Pei-Yuan Gao, both of San Jose; Richard Lamm, Union City, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/014,130

(22) Filed: Jan. 27, 1998

(51) Int. Cl.[7] .................. H01L 21/66; H01L 21/302; H01L 21/3065
(52) U.S. Cl. .............. 438/14; 438/16; 438/692; 438/693; 438/706; 438/745; 438/959
(58) Field of Search ................ 438/692, 693, 438/706, 745, 14, 16, 959

(56) References Cited

U.S. PATENT DOCUMENTS

| | | | |
|---|---|---|---|
| 3,979,238 A | * | 9/1976 | Justice .................. 438/756 |
| 4,238,275 A | * | 12/1980 | Shih ...................... 438/16 |
| 4,316,765 A | | 2/1982 | Thiel ..................... 156/626 |
| 5,378,318 A | * | 1/1995 | Weiling et al. ........... 438/697 |
| 5,510,652 A | * | 4/1996 | Burke et al. ............. 257/752 |
| 5,514,245 A | * | 5/1996 | Doan et al. .............. 438/693 |
| 5,535,005 A | | 7/1996 | Mukherjee-Roy et al. .. 356/371 |
| 5,575,886 A | * | 11/1996 | Murase .................... 438/692 |
| 5,650,619 A | | 7/1997 | Hudson .................... 250/302 |
| 5,663,797 A | | 9/1997 | Sandhu .................... 438/16 |

OTHER PUBLICATIONS

Ben–Porath et al., Automatic defect classification with invariant core classes, WO 00/03234, Jan. 20, 2000, pp. 1–53.*
Scratch Measurement Technique, IBM Technical Disclosure Bulletin, vol. 34, No. 4B, 263 anf 264, Sep. 1991.*

* cited by examiner

Primary Examiner—Benjamin L. Utech
Assistant Examiner—Lynette T. Umez-Eronini
(74) Attorney, Agent, or Firm—Foley & Lardner

(57) ABSTRACT

A method of decorating a semiconductor substrate with an etchant solution is provided for revealing defects, such as microscratches, resulting from an oxide chemical-mechanical planarization (CMP) polishing. An oxide layer is provided over the substrate made from, for example, tetra-ethylorthosilicate (TEOS). The oxide layer is polished by a CMP process which tends to leave behind microscratches and other defects that can cause conductivity problems on the wafer. To reveal the microscratches, the wafer is decorated or submerged in an etchant, such as an HF etchant, for a period of time. Following the decorating, the wafer is rinsed, dried and inspected. The method improves the ability to identify and optimize steps in a semiconductor fabrication process that cause semiconductor defects.

24 Claims, 2 Drawing Sheets

METHOD OF INSPECTING A SEMICONDUCTOR WAFER FOR DEFECTS

FIELD OF THE INVENTION

The present invention relates to an integrated circuit or semiconductor device. More particularly, the present invention relates to a method for decorating a semiconductor wafer to reveal defects.

BACKGROUND OF THE INVENTION

In the fabrication of integrated circuits (ICs), chemical mechanical planarization (CMP) is widely used for polishing inter-level dielectrics (ILD) on multi-layer devices which utilize interconnect structures. More recently, isolation schemes like shallow trench isolation (STI) have also made use of CMP.

In general, a CMP process involves holding a semiconductor wafer against a rotating polishing pad. A polishing slurry is added, e.g. a solution of alumina or silica, as the abrasive medium. The polishing slurry contains small, abrasive particles that polish the surface of the wafer. The content of this slurry determines its operability. Throughout the process, the wafer is kept under controlled chemical, pressure, velocity and temperature conditions.

CMP tends to leave surface defects, such as microscratches and particulate defects, on the surface or layer being planarized or polished. A microscratch is a small scratch, typically about 5 micrometers to 20 micrometers in length and 500 Å to 1000 Å in depth. These defects can result in connectivity problems between layers and components of the semiconductor device. Connectivity problems are compounded by subsequent mask and etch processes, the expected results of which can be disturbed by the presence of such defects, ultimately adversely effecting product yield and production cost.

Surface defects, such as microscratches, can be reduced or eliminated by adjusting the content and filtration of the slurry, and adjusting the composition of the layer being polished, e.g. an oxide layer, for greater resiliency to defects. However, microscratches are difficult to detect. Thus, in a fabrication process comprising multiple steps of etching, masking and deposition of layers on a substrate, it is difficult to identify which of these steps is causing the defects.

A variety of techniques currently exist for inspecting the surface of semiconductor wafers. These techniques include light scattering topography (LST), stylus profilometry, phase shift interferometry, and atomic force microscopy (FM). However, surface defects are not always readily visible with these conventional inspection methods due to the small size of microscratches and because they are typically filled with unwanted residual from a previously deposited layer. Thus, heretofore it has not been possible to identify microscratches in a post-CMP substrate and, consequently, it has not been possible to identify and optimize the step causing the microscratches.

Thus, there is a need for a semiconductor wafer inspection process that reveals surface defects, such as microscratches, to aid in isolation and optimization of defect-causing steps in the semiconductor fabrication process.

SUMMARY OF THE INVENTION

The present invention relates to a method of inspecting a semiconductor wafer for defects by providing a layer of material on the wafer, polishing the wafer to remove a portion of the layer, dipping the wafer in an etchant for a period of time, and inspecting the wafer for defects. The step of dipping reveals defects in the wafer that were previously undetectable, allowing isolation and optimization of the fabrication step causing the defects.

The present invention further relates to a method of inspecting a semiconductor wafer for defects due to chemical mechanical planarization (CMP) by providing an oxide layer on the wafer, polishing the wafer to remove a portion of the oxide layer, etching the wafer in a dilute etchant solution for a period of time, and inspecting the wafer for defects so that defects due to the CMP step can be examined.

The present invention further relates to a method of inspecting a semiconductor wafer for defects due to chemical mechanical planarization by providing a semiconductor wafer, providing an oxide layer on the wafer, polishing the wafer by CMP to remove at least a portion of the oxide layer, decorating the wafer with an etchant, and inspecting the wafer for defects using an optical inspection tool to determine a defect count.

BRIEF DESCRIPTION OF THE DRAWINGS

The preferred exemplary embodiment of the invention will hereinafter be described in conjunction with the appended FIGURES, in which like reference numerals denote like elements, and.

DETAILED DESCRIPTION OF THE PREFERRED EMBODIMENTS

Figure 1:
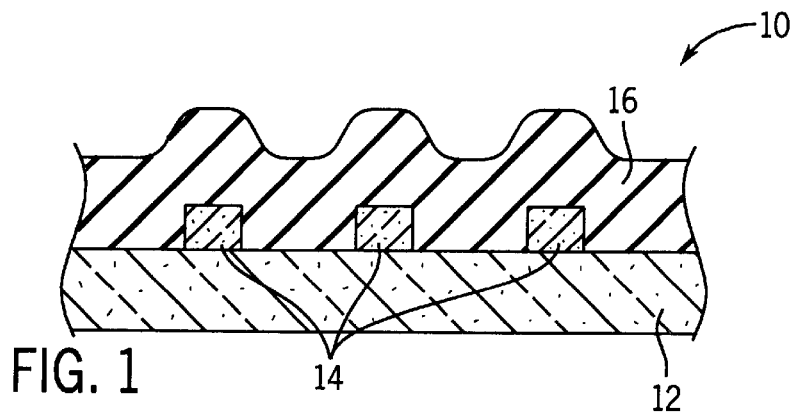
FIG. 1 is a cross-sectional view of a semiconductor substrate.

Referring to FIG. 1, there is shown a cross-sectional view of a semiconductor wafer 10. Semiconductor wafer 10 has a substrate 12 on which a plurality of IC components 14 have been formed. Components 14 may be any type of semiconductor device, transistor, or portion thereof made from any of the various semiconductor processes, such as complimentary metal oxide semiconductor (CMOS) process, bipolar process, etc. Substrate 12 is typically formed of a single crystal silicon material, or may be another semiconductive material such as germanium or gallium arsenide. IC components 14 are typically formed by an etch and mask process. Layer 16 is a layer of material, and may be any type of non-planar dielectric layer or insulative layer such as an oxide film, a pad oxide layer, an oxide layer deposited with tetraethylorthosilicate (TEOS), or a nitride layer. Layer 16 may be grown or deposited by chemical vapor deposition (CVD), physical vapor deposition (PVD), sputtering deposition, collimated sputtering deposition, dipping, evaporating, or other application techniques.

Figure 2:
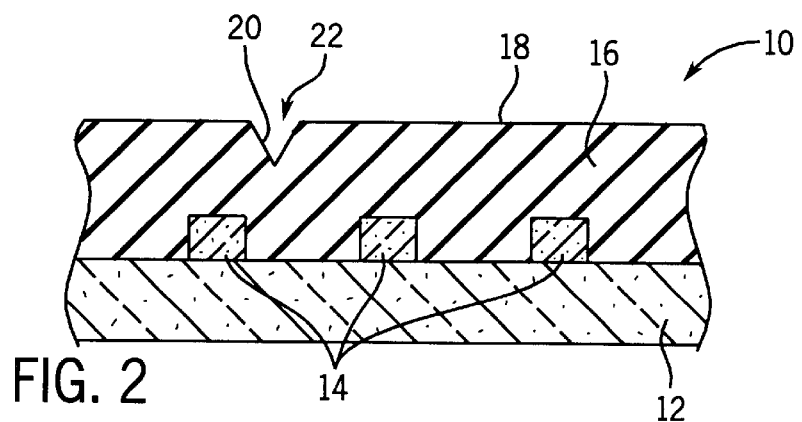
FIG. 2 is a cross-sectional view of the semiconductor substrate of FIG. 1 after CMP showing a microscratch.

Referring now to FIG. 2, semiconductor wafer 10 is shown after planarization or polishing. The polishing can be by oxide CMP, reaction ion etching, or another polishing technique that may leave defects. Layer 16 has been polished to a level top surface 18. It is now possible to apply subsequent layers, either conductive, semiconductive or insulative to the top surface 18 of layer 16. FIG. 2 also shows a scratch or microscratch defect 20 having a gap 22 caused by the polishing step.

Figure 3:
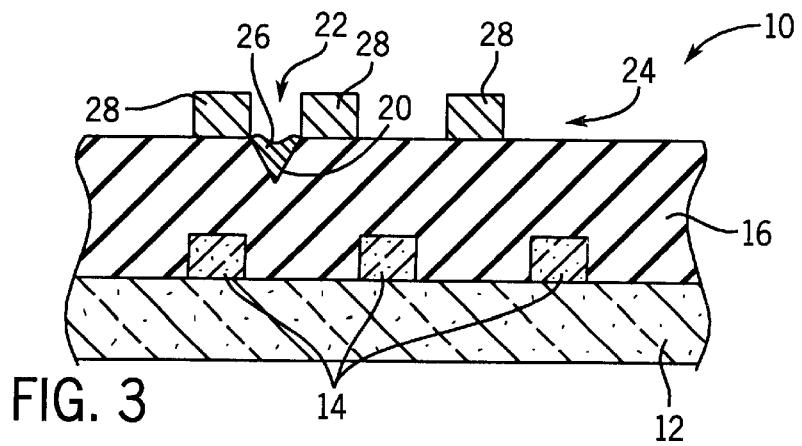
FIG. 3 is a cross-sectional view of the semiconductor substrate of FIG. 2 after deposition of a second layer of material.

Referring to FIG. 3, semiconductor wafer 10 is shown after deposition of a second layer of material 24, for example a layer of conductive material such as polysilicon. Second layer 24 is applied by one of a variety of application techniques, for example an etch and mask technique, to create a set of second components 28 above layer 16. FIG. 3 also shows an unwanted portion 26 of material 24 that has accumulated in gap 22 of microscratch defect 20. This unwanted portion 26 will create undesireable electrical properties of wafer 10. In particular, unwanted portion 26 is shown electrically shorting together two of the second set of components 28.

Figure 4:
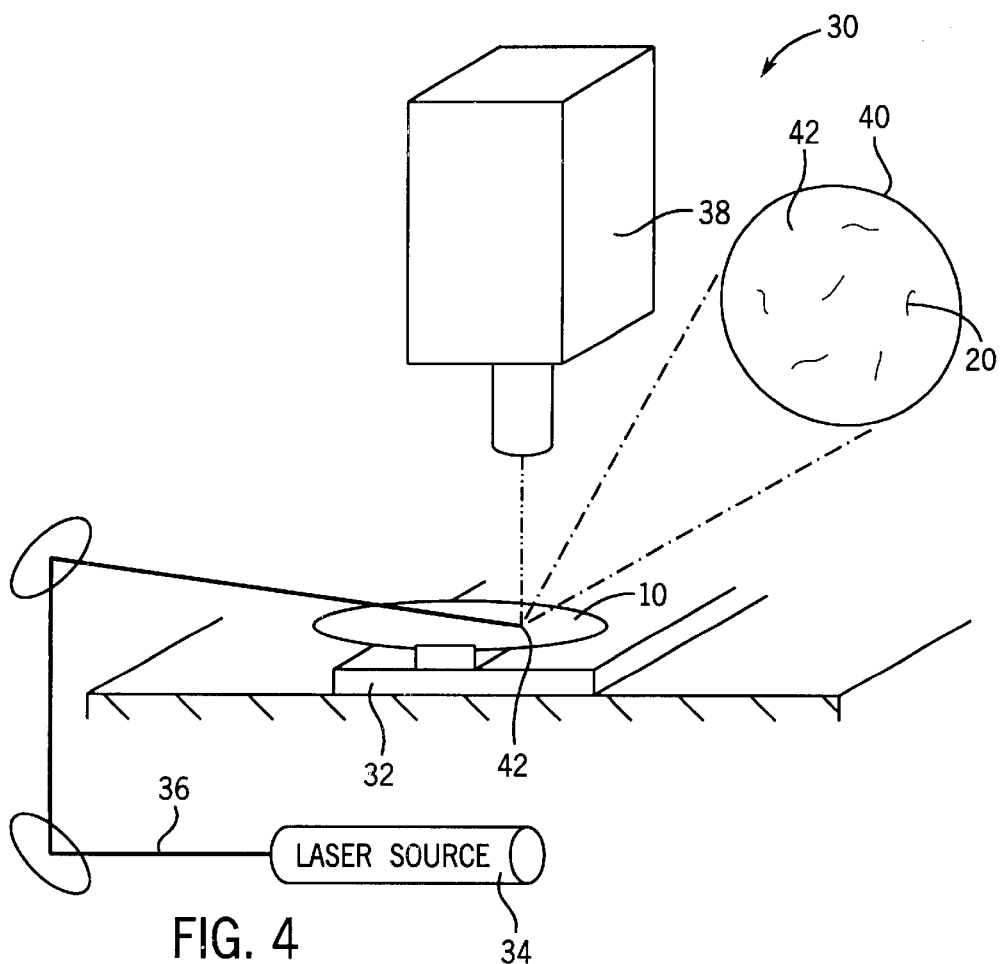
FIG. 4 is a perspective view of an inspection tool for identifying surface defects.

Referring now to FIG. 4, an inspection tool is shown for determining surface defects in semiconductor wafer 10. Inspection tool 30 is a light-scattering optical inspection device. Tool 30 may be any of a number of optical inspection tools known in the art, and is preferably an INSPEX 8525 manufactured by Inspex of Bellerica, Massachusetts. After polishing, semiconductor wafer 10 is placed on a platform 32 of inspection tool 30. Laser source 34 emits a laser 36 which produces scatter from wafer 10 into imaging camera 38. An enlarged view 40 of a portion 42 of wafer 10 showing microscratches 20 can be viewed on the computer screen of a nearby computer (not shown). By inspecting wafer 10 and counting the number of defects 20 in a given area, the defectivity of the polishing technique used can be evaluated.

Figure 5:
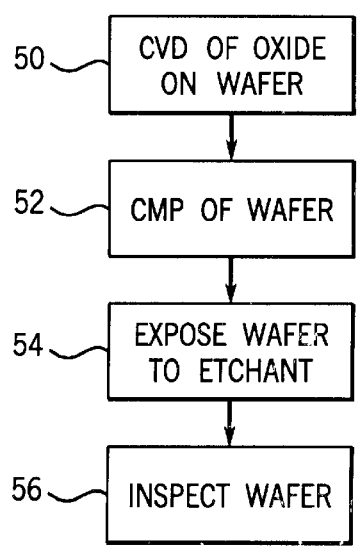
FIG. 5 is a flowchart showing a process according to the present invention.

Referring now to FIG. 5, there is shown a flowchart of a preferred embodiment of the present invention. At a step 50, semiconductor wafer 10 (FIG. 1) has layer of material 16 deposited thereon, preferably an oxide layer deposited by chemical vapor deposition (CVD). At a step 52, layer 16 is polished or planarized, preferably by a chemical mechanical planarization technique. The result of step 52 typically leaves defects 20 (FIG. 2), such as microscratches, in semiconductor wafer 10. These microscratches 20 are not detectable with conventional optical inspection tool 30 (FIG. 4).

Therefore, at a step 54, wafer 10 is exposed to or decorated with an etchant. The etchant may be any one of a variety of wet solutions or dry compositions that make defects 20 more visible with optical inspection tool 30. One suitable etchant is dilute hydrogen fluoride (HF). The HF may also be buffered (BHF or BOE, buffered oxide etch) with a mild acidic buffering agent to maintain a stable pH. HF can be readily obtained in a solution of water with a 30% concentration. The HF can then be diluted to about 100 parts water to 1 part HF. Suitable ratios of water to HF are from about 1:1 to about 200:1. The greater the concentration of HF used, the quicker microscratches 20 will be revealed. Another suitable etchant is phosphoric acid solution. However, phosphoric acid etches at approximately 3 Å/minute, an etching rate much slower than that of the HF solution. Thus, if a slower, more controlled etch is desired, phosphoric acid may be preferable. If a quicker etch is desired, the HF may be preferable. A dry etchant composition is typically a plasma etchant.

Decoration with etchant may be done in many ways, but preferably is done with a robotic arm that submerges or dips wafer 10 into the etchant for a period of time. The etchant acts on the entire exposed surface 18 of layer 16 (FIG. 2). However, because the microscratches 20 are weaker areas of surface 18, these areas are etched faster than the rest of layer 16. Thus, the greater the time that wafer 10 is submerged in the etchant, the more visible microscratches 20 become.

Wafer 10 may be submerged in the HF for about 10 to about 100 seconds, but preferably about 30 seconds. If phosphoric acid is the etchant, perhaps a longer period may be necessary. Subsequent to the submersion step, wafer 10 is rinsed with deionized water and dried with isopropyl alcohol vapor. Other rinsing and drying steps may be employed as well, e.g. air drying, spin drying, etc.

At a step 56, wafer 10 is inspected and defects 20 are counted. Defects 20 can now be seen with the use of conventional optical inspection tool 30. Defects 20 can be counted and compared to the defect counts left by other polishing techniques or optimizations. As a result, the present invention makes it possible to evaluate different types of oxide polishing slurries, slurry filtration effectiveness, slurry dilution methods, etc., which can be evaluated and optimized to obtain minimal micro-scratches on polished oxide wafers. Also, different types and compositions of oxides for STI applications with respect to their tendency to develop micro-scratches due to oxide CMP can be evaluated and optimized.

EXAMPLE

A 7200 Å layer of insulating material was deposited on two 200 millimeter blank silicon wafers by low-pressure chemical vapor deposition (LPCVD) technique utilizing tetraethylorthosilicate (TEOS). The first wafer was polished on an oxide CMP tool using a typical oxide CMP process to a post-polish oxide thickness of about 5000 Å. The second wafer, the control wafer, did not go through the polishing step. Both wafers were subjected to a typical post-polish cleaning and were subsequently inspected using an optical inspection tool, in this case an INSPEX 8525. A baseline defectivity level, or defect count, was obtained for both wafers. No significant differences in defectivity were observable between the first polished/cleaned wafer and the control non-polished/cleaned wafer. Both wafers were then decorated in a dilute HF dip for 30 seconds, rinsed and dried. The wafers were once again inspected for defects on the INSPEX 8525. This time there was a significant increase in the defectivity of the first, polished wafer compared to the control wafer. Most of the defects on the first, polished wafer were microscratches. Other defects included particulate defects.

Before the decorating step of the present invention, the microscratches were undetectable with the INSPEX tool. Thus, it was indeterminate at which step in the multi-layer fabrication process the microscratches were being created. Once it was identified that the oxide CMP was causing the microscratches, steps were taken to improve the CMP process. In this case, the polishing slurry of the CMP process was adjusted, thereby reducing the incidence of microscratches by two-thirds. Thereafter, a filter was added to the line that carries the CMP slurry, thereby reducing microscratches by another five-sixths. Thus, it can be seen that the feedback of the present invention improved this step of the fabrication process significantly.

It is understood that, while the detailed drawings and specific examples given describe preferred exemplary embodiments of the present invention, they are for the purpose of illustration only. The present invention is not limited to the precise details, methods, materials, and conditions disclosed. For example, although a wet HF etchant solution was used, other etchants, including dry etchants, may be employed. Further, although the present invention was applied to chemical mechanical planarization, it may also find uses in determining defects for other polishing, planarizing and semiconductor fabrication processes.

What is claimed is:

1. A method of inspecting a semiconductor wafer for defects, the wafer having a substrate, the method comprising:

providing a layer of material on the substrate;

polishing the layer to remove a portion of the layer;

etching the layer with an etchant under process conditions sufficient to reveal defects upon subsequent inspection with an inspection tool;

inspecting the layer for defects after the etching; and as a result of the inspection, controlling the polishing step.

2. The method of claim 1, wherein the defects include microscratches.

3. The method of claim 2, wherein the microscratches are about 5 micrometers to about 20 micrometers in length and about 500 Angstroms to about 1000 Angstroms in depth.

4. The method of claim 1, wherein polishing is done by chemical mechanical planarization.

5. The method of claim 1, wherein the etchant is a dilute hydrogen fluoride solution.

6. The method of claim 1, wherein the etchant is a phosphoric acid solution.

7. The method of claim 1, wherein the etchant is a dry etchant.

8. The method of claim 1 wherein the process conditions include etching for approximately 30 seconds.

9. The method of claim 1, wherein one of the process conditions is a period of time.

10. The method of claim 1, wherein the step of controlling includes adjusting a polishing slurry of the polishing step.

11. The method of claim 1, wherein a portion of the layer remains on the substrate after the etching step.

12. The method of claim 1, wherein the layer is an oxide layer.

13. A method of inspecting a semiconductor wafer for defects due to a processing step, comprising:

providing a layer of material on the wafer;

performing at least one processing step on the layer of material;

etching the layer of material with an etchant for a period of time;

inspecting the layer of material for defects after the etching; and as a result of the inspection, controlling the at least one processing step.

14. The method of claim 13 wherein the etchant is a wet etchant solution.

15. The method of claim 14 wherein the etchant includes hydrogen fluoride.

16. The method of claim 15 wherein the dilute hydrogen fluoride is between one part hydrogen fluoride to one part of water and one part hydrogen fluoride to two hundred parts water.

17. The method of claim 14 wherein the etchant is phosphoric acid.

18. The method of claim 14 wherein the period of time is between about 30 and 60 seconds.

19. The method of claim 13 wherein the at least one processing step includes chemical mechanical planarization.

20. The method of claim 13, wherein a portion of the layer of material remains on the substrate after the etching step.

21. A method of inspecting a semiconductor wafer for defects due to chemical mechanical planarization, comprising:

providing a semiconductor wafer;

providing a layer of material on the wafer;

polishing the wafer by chemical mechanical planarization to remove a portion of the layer of material;

decorating the layer of material with an etchant under process conditions sufficient to reveal defects upon subsequent inspection with an inspection tool; and inspecting the layer of material for defects after the decorating using the optical inspection tool to determine a defect count.

22. The method of claim 21 wherein the etchant is a dilute HF solution.

23. The method of claim 21, further comprising: as a result of the inspection, controlling the polishing step.

24. The method of claim 21, wherein a portion of the layer of material remains on the substrate after the etching step.

* * * * *